March 3, 1959 W. G. PFANN 2,875,505

SEMICONDUCTOR TRANSLATING DEVICE

Filed Dec. 11, 1952 2 Sheets-Sheet 1

INVENTOR
W. G. PFANN
BY Edwin B. Cave
ATTORNEY

March 3, 1959 W. G. PFANN 2,875,505

SEMICONDUCTOR TRANSLATING DEVICE

Filed Dec. 11, 1952 2 Sheets-Sheet 2

INVENTOR
W. G. PFANN
BY Edwin B. Cave
ATTORNEY

United States Patent Office 2,875,505

Patented Mar. 3, 1959

2,875,505

SEMICONDUCTOR TRANSLATING DEVICE

William G. Pfann, Basking Ridge, N. J., assignor to Bell Telephone Laboratories, Incorporated, New York, N. Y., a corporation of New York Application December 11, 1952, Serial No. 325,489

3 Claims. (Cl. 29—25.3)

This invention relates to semiconductive translating devices, and more particularly to such devices containing a multiplicity of PN boundaries and also to methods by means of which the aforesaid devices may be made.

By use of the methods described in this specification, semiconductor arrays may be constructed. P–N junctions are arranged in parallel arrays so that the current-carrying capacity of the devices is enhanced or they are arranged in series configuration so as to increase the back voltage characteristics, or current or voltage multiplication factor.

In general, the devices of this invention are manufactured by producing small regions of one conductivity type within semiconductor regions of a second conductivity type. Alternate methods, some of general application and some of special application, are described. The critical technique in the production of both types of arrays is in the control of the transformation of conductivity type particularly as to the size and disposition of the resultant regions of opposite conductivity type. Such control is effected by close attention to the starting materials and to the time and temperature at which the conversion takes place, or may be dependent upon shielding techniques, the purpose of which is to prevent the transformation of certain selected portions of the starting material.

The conductive properties of the devices herein described are of the extrinsic type and are induced by small amounts of material which have become generically known to those skilled in the art as significant impurities. Examples of materials, the conductivity properties of which are affected by significant impurities, are silicon and germanium of group IV of the periodic table according to Mendelyeev. Examples of significant impurities which are the primary cause of the conductivity characteristics of such materials with which the devices of this invention are concerned are the P-type impurities of group III of the same periodic table such as boron, aluminum, gallium and indium and N-type impurities phosphorus, arsenic, antimony and bismuth of group V of the aforesaid periodic table. In addition to the above impurities of groups III and V of the periodic table, it is now recognized that certain other elements affect the conductivity characteristics of semiconductors of the nature of silicon and germanium. For example, in the description of this invention the use of copper as an acceptor or material inducing P-type conductivity in germanium will be discussed.

It is to be understood that although the following description is chiefly in terms of a starting body of N-type germanium, the starting material may just as well be N-type silicon, P-type germanium or silicon, or any other semiconductive material the semiconductive type of which may be changed by the introduction or segregation of significant impurities. It is to be further understood that these significant impurities are not limited to materials which are purposely added to the starting material, but may be present before the process is begun.

The invention may be more easily understood by reference to the following drawings in which.

Referring again to Fig. 1, the body shown is N-type germanium in which unshaded portion 1 has been unaffected by treatment while shaded region 2 is a region of P-type conductivity within the body and projecting through to the underside. Such a device may be constructed by depositing gold or other material which induces P-type conductivity in N-type germanium through one mask having a comb-shaping opening. The mask openings corresponding with the teeth of the comb may be, for example, two mils wide. The entire body is then heat treated so as to cause the gold to diffuse into the N-type germanium and produce a region of P-type conductivity. Since it is to be expected that diffusion will occur in a lateral direction at about the same rate as perpendicularly and since the P regions are to be connected only at one extremity as depicted, dimension 3 is dependent on the depth to which diffusion is allowed to proceed, this dimension being somewhat greater than twice the depth. It is not necessary for the converted region to extend through to the underside of the body.

Figure 1:
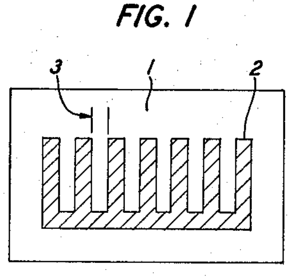
Fig. 1 is a plan view of a parallel array.

In the device of Fig. 1 all of the strips are connected in parallel and hence the configuration is one of P regions in parallel. Exposure of such an arrangement to light results in an increase of the photocurrent over that which would be produced by a single strip. The photovoltage is equal to that for an individual PN cell.

Figure 2:
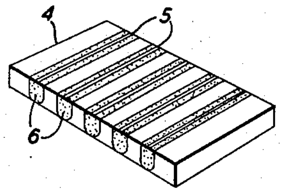
Fig. 2 is a perspective view of a series array.

N-type germanium body 4 of Fig. 2 containing isolated P-type regions 6 are produced by the deposition of, for example, gold through a wire grid such as that used in the production of the device of Fig. 1 to form isolated strips 5 and subsequent diffusion heat treatment sufficient to cause the P-type conductivity regions 6 to penetrate to the underside of the germanium. The starting body is of the order of 5 or 10 mils in thickness and the strips are deposited transverse to the long direction of the body and extend completely across it. The result is a series arrangement of PN cells, but with adjacent ones opposed so that the back voltages of succeeding cells are of opposite polarity. While this arrangement is useful in certain instances, its general effectiveness is considerably increased by providing a shunt across alternate PN barriers. A method by which this may be done is described in connection with Fig. 4A.

Figure 3:
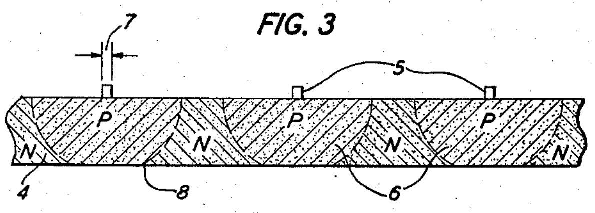
Fig. 3 is a cross-sectional view of a portion of a body of semiconductive material indicating portions which have been converted to opposite conductivity type by a method to be described.

Fig. 3 is a cross-sectional view of the body depicted in Fig. 2 after diffusion treatment. Gold strips 5 are still in evidence although P regions 6 have already been formed within N body 4. Since, out of space considerations, it is generally advantageous to minimize the portion of the material converted to P-type conductivity so that the largest number of PN junctions may be formed within the same body of material, it is preferred to limit the thickness 7 of the deposited gold strips. Where the thickness 7 is negligible, and with proper temperature and time of conversion, the resultant converted region 6 is semicircular with strip 5 as the axis and with surface 8 cutting off a small arc. It follows that where it is desired to have through conversion, strips 5 should be no closer than slightly more than twice the thickness of body 4 where dimension 7 of strip 5 is small. Although in Fig. 3 strips 5 are still in evidence, this is for the purpose only of simplifying the discussion of that figure. Ideally the amount of gold or other P-type material used to make up strips 5 is such that little or none will remain on the surface of body 4 after the diffusion step.

Figure 4B:
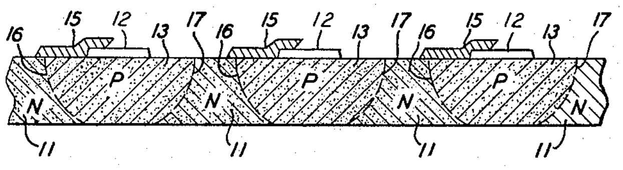
Fig. 4B is a cross-sectional view of a device constructed by the process of Fig. 4A.
Figure 4A:
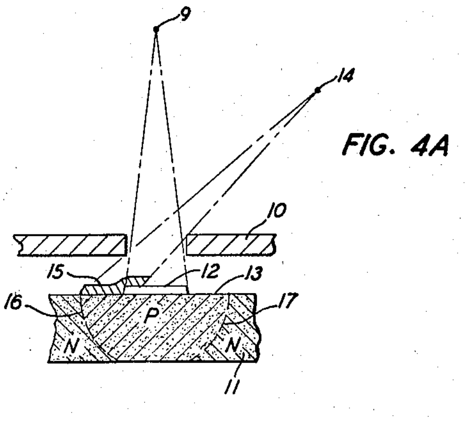
Fig. 4A is a schematic view of apparatus for carrying out a diffusion process which may be used for the production of devices to be described.

Figs. 4A and 4B show a method by which alternate PN boundaries of a body such as that shown in Fig. 3 may be shunted so that succeeding PN junctions will not be in series opposition and so that the effect may be cumulative, while Fig. 4B shows a portion of a body treated by the method shown in Fig. 4A. According to the process shown in Fig. 4A, gold or other acceptor type impurity from source 9 is vaporized through mask 10 onto N-type body 11 thereby producing layer 12, which subsequently is diffusion heat treated so that P region 13 is formed within the body. A conductor at source 14 is then vaporized through mask 10 thereby forming conductive layer 15 which layer has the effect of providing a low resistance path thereby shunting junction 16. This procedure is carried out at several locations thereby producing the body shown in Fig. 4B. Fig. 4B shows N regions 11, P regions 13 and PN boundaries 16 shunted by metal layers 15 so that PN boundaries 17, the only boundaries which are operative in the finished product, are in series and so that back voltage and voltage amplification factors of these boundaries are cumulative.

The series pile of PN cells of Fig. 4B has a number of desirable features. It is a series arrangement of PN rectifiers and hence provides very high reverse voltages. Regarded as a series arrangement of phototransistors, it has a large effective photosensitive area and is capable of producing large output voltages. It may also be used as a photoelectric generator of power, the photovoltages of the individual functions being additive.

While the series pile may be made in any convenient width, the smallest length which can be practically attained for a single cell will depend on the thickness of the germanium slice where this diffusion method is used. For a slice thickness of 10 mils the minimum length of a cell which is feasible appears to be about 30 mils. This value decreases in proportion to the slice thickness. Thus, it is seen that with a slice thickness of the range of 10 mils, about 30 cells may be contained in a semiconductor body less than one inch in length.

It is now known that copper is a suitable acceptor for germanium and it is suitable for use in the method of Fig. 4A and in the production of the materials of Figs. 1, 2, 3, and 4B. This impurity is especially useful in such a process because it diffuses rapidly and further because its surface diffusion rate is substantially identical to its volume diffusion rate, so that the theoretical semicircular form is more readily attained. The use of copper as an acceptor element in germanium is described in a letter to the Editor of the "Physical Review," by C. S. Fuller and J. D. Struthers, vol. 87, No. 3, pages 526–527. As an example of diffusion time of copper as an acceptor element, in N-type germanium, heating for two minutes at a temperature of 825° C. causes a 50-mil penetration with a concentration of about $2\times10^{15}$ atoms per cubic centimeter at this depth. Where copper is to be used as an acceptor element in germanium, and where it is introduced by means of diffusion brought about by heating, it is necessary that the surface of the germanium be extremely clean. This condition is met by grinding the surface of the germanium with a suspension of quartz particles in a medium of distilled water. Although it is not necessary in the diffusion process, it may be advantageous to etch the surface of the germanium by any one of the high lifetime etch methods known to the art. It should be understood that the method discussed in connection with Fig. 4A is merely illustrative. In the alternate, shunting of PN boundaries may be by means of vaporizing through mask 10 from source 9 or another vertical source after shifting mask 10 laterally to bring the slits in line with alternate boundaries. Also low resistance paths may be provided for example, by means of plated strips or external wires.

Figure 5:
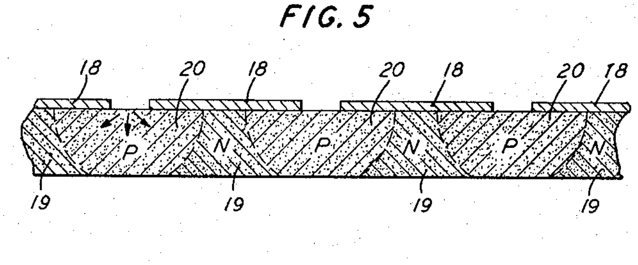
Fig. 5 is a cross-sectional view of a portion of a body of material containing a multiplicity of PN boundaries made by a process to be described.

Fig. 5 shows a body treated by a method alternative to that described in connection with Fig. 4A. By this process, strips 18 of a masking layer of a metal having a comparatively slow diffusion rate in germanium, such as, for example, gold or silver, are first plated or deposited on N germanium body 19. The entire body is then heat treated so that P regions 20 are formed by conversion originating at those portions of the germanium surface not covered by the masking layer. Heat treatment and conversion in germanium, using copper as an acceptor, may be accelerated by first treating the areas of the germanium surface, between the areas 18 of masking layer, with a metal compound including oxygen such as, for example, copper oxide, tungsten oxide, cobalt oxide, bismuth oxichloride and iron oxide. As an example, the plated material is immersed for five minutes in a solution of ammonia water and aqueous copper sulfate and then, after being blotted dry, is heated for a period of about twenty seconds at 750° C. in air. It is quenched by sliding onto a cold metal block. After P regions 20 have been formed, strips 18 are removed by grinding or etching, and shunting strips, not shown, are deposited over alternate PN boundaries, for example by vaporizing through a mask according to the method of Fig. 4A. Shunting strips may be composed of metals such as platinum, gold, tin or silver preferably alloyed with small quantities of donor and acceptor elements for germanium. A typical alloy is composed of .1 percent antimony, .1 percent gallium and remainder gold.

Figure 6:
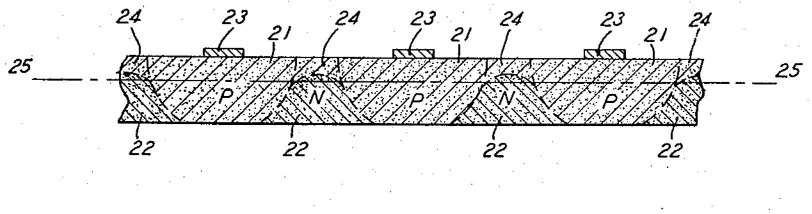
Fig. 6 is a cross-sectional view of a portion of a body of material undergoing a treatment alternate to that which will be discussed in relation with Fig. 5.

If the rate of surface diffusion is more rapid than that of volume diffusion as, for example, it is for gold in germanium with the method described in connection with Fig. 4A, removal of surface portions of the treated body will improve the separation of successive converted zones. This may be done, for example, by the method described in connection with Fig. 6. In Fig. 6 the P regions 21 have been formed in the N-type body 22 by diffusion into body 22 of material of strips 23. It is seen, however, that with the material chosen the rate of surface diffusion is sufficiently rapid so that interconnecting P regions 24 are formed. Consequently, all of the resulting PN boundaries are by-passed. If all of the body above plane 25 is then ground away, for example, by use of a diamond or other abrasive wheel, alternate P and N regions will result. A series array may then be constructed by depositing shunting strips across alternate PN boundaries as has been hereinbefore described.

Figure 7:
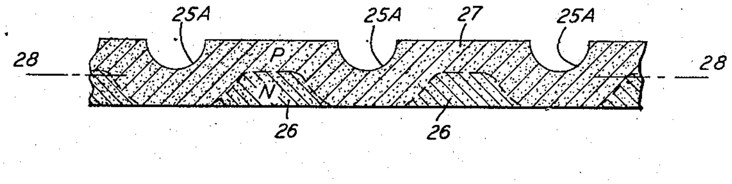
Fig. 7 is a cross-sectional view of a portion of a body of material undergoing still a different process.

According to the process of Fig. 7, grooves 25A are first made in N germanium body 26, the entire upper surface of the body is then coated with, or exposed to, an acceptor element which is caused to diffuse into the body 26 so as to form P region 27, after which the portion of the body above plane 28 is ground away, thereby producing alternate N and P regions. If a series array is desired, the shunting strips are then deposited across alternate PN boundaries.

Figure 8:
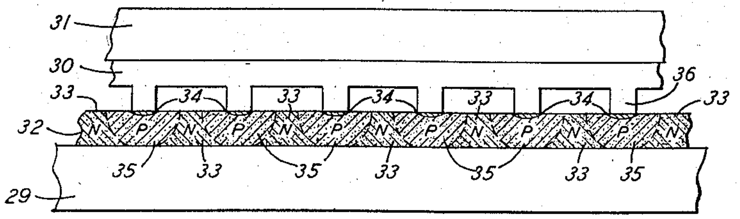
Fig. 8 is a cross-sectional schematic view of a body of material undergoing treatment together with the apparatus which is being used.

The method of Fig. 8 utilizes remelt techniques described in my copending application Serial No. 256,719, filed November 16, 1951. According to this process, the starting material contains a preponderance of a donor impurity having a $\lambda$ value less than 1 such, for example, as arsenic, and a smaller amount of an acceptor element having either a λ value greater than 1, such for example as boron, or a λ value less than 1, but of an absolute value greater than that of the donor impurity. Such a material is placed on quartz or graphite base 29 and heat sufficient to melt the germanium through its thickness under each of the projecting portions 36, but not sufficient to melt the entire body of germanium, is applied to quartz remelt template 30 by means of feeder 31. When such portions are melted and allowed to refreeze, body 32 containing N regions 33 and 34 and P regions 35, results. Small N regions 34 may be disregarded. Shunting strips may be applied to alternate PN boundaries between P regions 35 and N regions 33, as has been described. Operating details, such as time and temperature, and a discussion of the requirements of any system in which such remelt junctions are to be formed, is contained in my copending application above cited.

What is claimed is:

1. The method of converting alternate regions of a body of semiconductive material of one conductivity type to the other conductivity type by depositing strips containing significant impurity capable of inducing conductivity of the said opposite conductive on the surface of the said body by deposition through a mask, heat treating to diffuse said significant impurity into the body, and providing electrically conducting paths shunting alternate p–n junctions by the deposition of a low resistance material through a mask, so that alternately spaced isolated regions of opposite conductivity types with p–n junctions at the intersections of the said regions are produced and so that alternate p–n junctions are shunted by the said low resistance material.

2. The method of claim 1 in which the deposition of the said significant impurity and the deposition of the said low resistance material are both through the same mask.

3. The processes of claim 2 in which the said mask is maintained in fixed position relative to the said body and in which the directions of deposition of the said significant impurity and the said low resistance material are different.

References Cited in the file of this patent

UNITED STATES PATENTS

| | | |
|---|---|---|
| 2,561,411 | Pfann | July 24, 1951 |
| 2,666,814 | Shockley | Jan. 19, 1954 |
| 2,667,607 | Robinson | Jan. 26, 1954 |